United States Patent [19]

Hechtman et al.

[11] Patent Number: 4,795,920
[45] Date of Patent: Jan. 3, 1989

[54] METHOD AND APPARATUS FOR SOURCING AND SINKING CURRENT

[75] Inventors: Charles D. Hechtman, Hopewell, N.J.; Ilyoung Kim, Holland, Pa.

[73] Assignee: American Telephone and Telegraph Company, New York, N.Y.

[21] Appl. No.: 79,575

[22] Filed: Aug. 3, 1987

[51] Int. Cl.$^4$ .................. H03K 3/353; H03F 3/45
[52] U.S. Cl. .................. 307/270; 307/473; 307/571; 307/572
[58] Field of Search ............ 307/270, 473, 241–244, 307/571–583; 330/253

[56] References Cited

U.S. PATENT DOCUMENTS

| | | | |
|---|---|---|---|
| 3,673,438 | 6/1972 | Lund | 307/270 |
| 3,961,279 | 6/1976 | Davis | 330/253 |
| 4,126,830 | 11/1978 | Schade | 330/277 |
| 4,135,292 | 1/1979 | Suzuki et al. | 307/355 |
| 4,280,065 | 7/1981 | Minato et al. | 307/473 |
| 4,465,945 | 8/1984 | Yin | 307/473 |
| 4,644,196 | 2/1987 | Flannagan | 307/473 |
| 4,686,396 | 8/1987 | Law et al. | 307/571 |
| 4,712,025 | 12/1987 | Weiss | 307/571 |

Primary Examiner—Stanley D. Miller
Assistant Examiner—N. Thai
Attorney, Agent, or Firm—Robert B. Levy

[57] ABSTRACT

A driver circuit for alternately sourcing current to, and sinking current from a load (12) comprises a pair of field effect transistors (20 and 22), each having its drain-to-source portion coupled between the load and a separate one of a pair of voltage sources ($V_H$ and $V_L$) which serve to source and sink current, respectively. Each of a second pair of field effect transistors (24 and 26) has its drain-to-source portion coupled between the gate of a separate one of the first pair of field effect transistors and a current source (28). The gate of each of the field effect transistors of the second pair is supplied with a separate one of a pair of electrical signals $V_i'$ and $V_i'^*$ which alternately shift in amplitude. The control signals $V_i'$ and $V_i'^*$ render the field effect transistors of the second pair alternately nonconductive, thereby rendering the first pair of field effect transistors (20 and 22) alternately conductive to sink and source current, respectively.

7 Claims, 1 Drawing Sheet

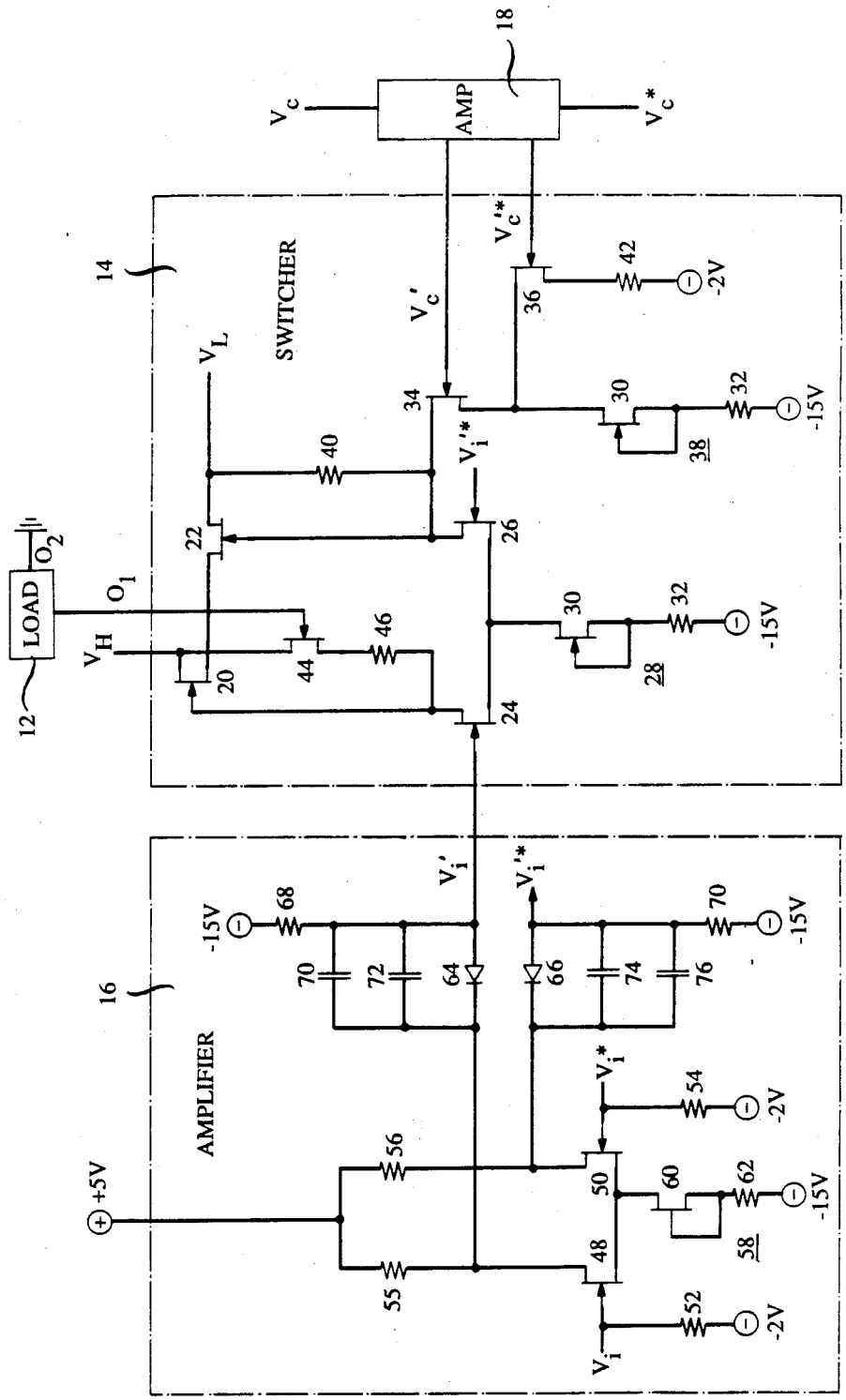

METHOD AND APPARATUS FOR SOURCING AND SINKING CURRENT

TECHNICAL FIELD

This invention relates to a driver circuit for alternately sourcing current to, and for sinking current from, a load and alternatively, for presenting a high impedance thereto.

BACKGROUND ART

Circuit boards embodying one or more components are usually tested at least once during manufacture to determine whether the board is operating properly. Often, the board is subjected to an in-circuit test during which the operation of each component on the board, such as an integrated circuit or the like, is tested by monitoring the response of the component to various test signals input thereto. During in-circuit testing, it is desirable to isolate the component under test from changes in the signals supplied by integrated circuits on the board not under test. Otherwise, such changes in signals from the integrated circuits not under test may adversely affect the test results.

A common way in which the component under test is isolated from such signal changes is to back drive the integrated circuits which supply the signals to the component. Back driving of each integrated circuit is accomplished by either sourcing current to, or sinking current from the output of the integrated circuit, depending on whether the output signal is at a logic high or logic low state, respectively. In this way, the output signal of the integrated circuit can be held at a particular logic level, regardless of the input to the integrated circuit. Thus, the output signal supplied from the integrated circuit to the component under test may be held at a known level.

Often it is desirable to test each component while the input signals supplied thereto from the integrated circuits not under test alternate between a high and low state at a rate near the operating frequency of the component under test. If the output signals of the integrated circuits are to alternate at a given rate, notwithstanding the state of the input signal supplied thereto, then current must be alternately sourced to, and sunk from the output of the integrated circuits at such a rate. In some instances, the operating frequency of the components on the board is 100 MHz or greater, requiring current to be alternately sourced to, and sunk from the integrated circuits not under test at the same rate.

Conventional driver circuits exist for alternately sourcing current to, and sinking current from a load, such as an integrated circuit. Most conventional driver circuits, however, cannot alternately source and sink current at a rate much above 20 MHz because of the manner in which they are constructed. Conventional driver circuits usually have an output stage comprised of a pair of bipolar transistors which have their collector-to-emitter portion coupled between a separate one of a pair of positive and negative voltage sources, respectively, and the load to be back driven. The conductivity of each of the first pair of transistors in the output stage is controlled by an input signal supplied by a separate one of a second pair of bipolar transistors. The transistors of the second pair are each supplied at their base with a separate one of a pair of square wave signals 180° out of phase with each other so that the transistors are alternately rendered conductive. As a result, the transistors of the first pair are alternately rendered conductive, causing current to be alternately sourced to, and sunk from the load.

It is desirable to operate the above-described prior art driver circuit such that each of the first pair of transistors in the output stage is driven into and out of saturation. In this way, the output current of each of the first pair of transistors will not undesirably vary linearly with the input current supplied by a separate one of the second pair of transistors. However, the disadvantage of operating the first pair of bipolar transistors in their saturated state is that the switching speed of the transistors will be limited, limiting the rate at which current can be alternately sourced to, and sunk from the load.

One way to increase the operating speed of a conventional driver circuit would be to substitute a high-speed metal semiconductor field effect transistor (MESFET) in place of each of the first pair of bipolar transistors. The difficulty with this approach is that the transistors of the second pair in the conventional driver circuit, which would control the conductivity of a separate one of the MESFETs, are typically operated so the collector current in each never approaches zero. However, to assure that the MESFETs would turn on strongly, the transistors of the second pair in the conventional driver circuit would have to operate in their cutoff region, which would severely degrade the performance of such a driver circuit. For this reason, field effect transistors have not been widely used in conventional driver circuits.

Thus, there is a need for a driver circuit capable of alternately sourcing and sinking current at a very high rate.

BRIEF SUMMARY OF THE INVENTION

Briefly, the foregoing disadvantages are overcome by the driver circuit of the present invention for alternately sourcing current to, and for sinking current from a load. The driver circuit includes first and second high-power, high-speed field effect transistors (FETs), each having its drain-to-source portion coupled between a current sink and the gate of a separate one of a third and fourth high-frequency, high power FET, respectively, such that the drain of each of the first and second FETs is at a potential as great or greater than the source. Each of the third and fourth FETs has its drain-to-source portion coupled between the load and a separate one of a first and second voltage source, the first having a higher potential than the second, such that the drain of each of the first and second FETs is at a potential as great or greater than the source. The drain-to-source portion of each of the third and fourth FETs provides a path for current to pass from the first voltage source to the load and from the load to the second voltage source, respectively, while the respective FET is conductive.

The conductivity of each of the third and fourth FETs is controlled by a separate one of the first and second FETs. While a separate one of the first and second FETs is rendered conductive, current is drawn from the gate of a respective one of the third and fourth FETs to render it nonconductive. The first and second FETs are themselves alternately rendered nonconductive by virtue of being supplied at their gate with a separate one of a pair of electrical signals which alternately shift between a first and a second logic level so as to be 180° out of phase with each other. When the first and second field effect transistors are alternately rendered nonconductive, the third and fourth FETs are alternately rendered conductive, causing current to be sourced to, and sunk from the load. The third and fourth FETs can be alternately rendered conductive at a very high frequency so as to permit current to be alternately scoured to, and sunk from the load at a fast rate. Moreover, utilizing a separate one of the first and second FETs to control the conductivity of a separate one of the third and fourth FETs permits each of the latter to be turned very strongly without any degradation of performance.

In accordance with another aspect of the invention, a method is provided for alternately sourcing current to, and sinking current from a load. The method includes the step of applying first and second electrical signals, which alternately shift from a first to a second level, so as to be 180° out of phase with each other, to the gate of a separate one of a first and second high-speed, high-power FETs, respectively. The first and second FETs have their drain-to-source portion coupled between a current sink and the gate of a separate one of a third and fourth high-power, high-speed FET, respectively, such that the drain of each of the first and second FETs is at a potential as great or greater than the source. The first and second FETs are alternately rendered nonconductive by the first and second electrical signals. The third and fourth FETs have their drain-to-source portion coupled between the load and a separate one of a pair of voltage sources which source and sink current, respectively, such that the drain of each FET is at a potential as high or as higher than the source. The third and fourth FETs are alternately conductive when the first and second FETs are alternately rendered nonconductive.

BRIEF DESCRIPTION OF THE DRAWING

FIG. 1 is an electrical schematic diagram of a driver circuit constructed in accordance with the teachings of the present invention.

DETAILED DESCRIPTION

FIG. 1 there is shown a block schematic diagram of a driver circuit 10, in accordance with the present invention, for sourcing current to or sinking current from a load 12, and alternatively, for presenting a high impedance to the load. The driver circuit 10 comprises a switcher 14 and a pair of amplifiers 16 and 18 which each supply a pair of signals $V_i'$ and $V_i'^*$, and $V_c'$ and $V_c'^*$, respectively, to the switcher to control its operation in accordance with a separate one of a pair of externally-generated control signals $V_i$ and $V_i^*$, and $V_c$ and $V_c^*$, respectively.

The switcher 14 comprises a pair of high-speed, high-power field effect transistors (FETs) 20 and 22, each having its drain-to-source portion coupled between a first terminal $O_1$ of the load 12 and a separate one of a pair of voltage sources $V_H$ and $V_L$ (not shown) which typically supply +5 volts and −3.0 volts dc, respectively. The FETs 20 and 22 are connected such that the drain of each is at a potential as a high as or higher than the source. The load 12 has a second terminal $O_2$ coupled to circuit ground. When the FETs 20 and 22 are alternately rendered conductive in a manner described hereinafter, the drain-to-source portion of each of the FETs provides a path for current to pass to the load 12 from the voltage source $V_H$ and from the load to the voltage source $V_L$, respectively.

The conductivity of each of the FETs 20 and 22 is controlled by a separate one of a pair of high-power, high-frequency FETs 24 and 26, each having its drain-to-source portion coupled between the gate of a separate one of the FETs 20 and 22, respectively, and a current sink 28. The current sink 28 is comprised of a high-speed FET 30 whose drain-to-source portion is coupled in series with a resistor 32 between the source of each of the FETs 24 and 26 and a −15 volt dc power supply (not shown). The gate and source of the FET 30 are connected together so that the gate-source voltage is held at zero volts, causing the FET to be in the saturated region and sink current from each of the FETs 24 and 26 while each is conductive.

The FETs 24 and 26 are coupled in differential fashion so that when one of the FETs is rendered conductive, the other remains substantially nonconductive. The conductivity of each of the FETs 24 and 26 is controlled in accordance with the logical level of a separate one of the pair of signals $V_i'$ and $V_i'^*$ supplied to the gate of each FET from the amplifier 16. As will be described in greater detail, the control signals $V_i'$ and $V_i'^*$ alternate between a first level of about −8.5 volts and a second level of about −12.5 volts, so that while one is at the first level, the other signal is at the second level and vice versa. While the control signals $V_i'$ and $V_i'^*$ are at the first and second levels, respectively, the voltage at the gate of each of the FETs 24 and 26 is above and below, respectively, the threshold value of each device, so that the FETs will be conductive and nonconductive, respectively. Conversely, once the control signals $V_i'$ and $V_i'^*$ shift to the second and first levels, respectively, the FETs 24 and 26 become nonconductive and conductive, respectively.

While each of the FETs 24 and 26 is conductive, the voltage between the gate and source of a separate one of the FETs 20 and 22 becomes sufficiently negative to prevent the corresponding FET from conducting any significant current. Thus, by alternately rendering the FETs 24 and 26 conductive, the FETs 20 and 22 are alternately rendered substantially nonconductive. When the FETs 20 and 22 are alternately rendered substantially nonconductive, current is alternately sunk from, and sourced to the load 12, respectively.

The switcher 14 also includes a pair of high-power, high-frequency FETs 34 and 36. The FET 34 has its drain-to-source portion coupled between the drain of the FET 26 and a current sink 38 which is configured identically to the current sink 28. The drain of the FET 34 is also coupled by a resistor 40 to the source of the FET 22. The FET 36 has its drain-to-source portion coupled in series with a resistor 42 between a −1 volt dc power supply (not shown) and the current sink 38.

Like the FETs 24 and 26, the FETs 34 and 36 are coupled in differential fashion so that while one is rendered conductive, the other remains substantially nonconductive. The conductivity of each of the FETs 34 and 36 is controlled in accordance with a separate one of the pair of signals $V_c'$ and $V_c'^*$ supplied to the gate of a separate one of the FETs by the amplifier 18. The control signals $V_c'$ and $V_c'^*$ alternate between a first level of approximately −12.5 volts and a second level of approximately −8.5 volts. While the control signals $V_c'$ and $V_c'^*$ are at the first and second levels, respectively, the voltage at the gate of the FETs 34 and 36 remains below and above, respectively, the threshold value of each device, so that the FETs remain nonconductive and conductive, respectively. Conversely, when the control signals $V_c'$ and $V_c'^*$ shift to the second and first levels, respectively, the FETs 34 and 36 become conductive and nonconductive, respectively.

While the FETs 34 and 36 are nonconductive and conductive, respectively, current passes through the FET 36 from $-2$ volt power supply and then into the current sink 38 while substantially no current passes through the FET 34. Once the FETs 34 and 36 become conductive and nonconductive, respectively, then a large electrical current, typically on the order of 170 ma, passes from the voltage source $V_L$ through the resistor 40 and the FET 34 before entering the current sink 38. While the FET 24 is conductive, sufficient current passes in the resistor 40 to cause a large enough voltage to appear between the source and gate of FET 22 to hold it nonconductive even while the FET 26 has been rendered substantially nonconductive. During the interval that both of the FETs 20 and 22 are nonconductive, a high impedance appears at the load 12.

While both of the FETs 20 and 22 remain substantially nonconductive, it is desirable to provide a path for current to flow from the voltage source $V_H$ to the current sink 28 without affecting the load 12. Such a current path is provided by an FET 44 which has its drain-to-source portion coupled in series with a resistor 46 between the drain and gate of the FET 20. The gate of the FET 44 is coupled to the junction of the source and drain of the FETs 20 and 22, respectively. While the FET 20 remains substantially nonconductive, the voltage between the gate and source of the FET 44 becomes high enough to render this device conductive and permit current to pass the current sink 38 and away from the load 12.

The amplifiers 16 and 18, which serve to supply the control signals $V_i'$ and $V_i'^*$, and $V_c'$ and $V_c'^*$, respectively, to the switcher 14 in accordance with the output signals $V_i$ and $V_i^*$, and $V_c$ and $V_c^*$, respectively, are identical to each other. Therefore, only the amplifier 16 will be described in detail. The amplifier 16 includes a pair of FETs 48 and 50, which are each supplied at their respective gates with a separate one of the control signals $V_i$ and $V_i^*$, respectively. The gate of each of the FETs 48 and 50 is also coupled via a separate one of a pair of resistors 52 and 54 to a $-2$ volt dc supply (not shown) to provide termination for the transmission lines (not shown) which carry the signals $V_i$ and $V_i^*$ to the gate of the respective FETs.

Each of the FETs 48 and 50 has its drain-to-source portion coupled in series with a separate one of a pair of resistors 55 and 56, respectively, between a 5 volt dc supply (not shown) and a current sink 58. The current sink 58 includes a high-frequency FET 60, which has its drain-to-source portion coupled in series with a resistor 62 between the junction of the source of each of the FETs 48 and 50, and a $-15$ volt dc supply (not shown). The gate and source of the FET 60 are coupled together so that the gate-source voltage remains at zero, so that the FET may operate in the saturated region.

The junction between each of the resistors 55 and 56 and the drain of each of the FETs 48 and 50, respectively, is coupled to the cathode of a separate one of a pair of Zener diodes 64 and 66, each having a 13 volt threshold. The anode of each of the Zener diodes 64 and 66 is coupled to the gate of a separate one of the FETs 24 and 26, respectively. Also, the anode of each of the Zener diodes 64 and 66 is coupled via a separate one of a pair of resistors 68 and 70 to the $-15$ volt dc supply so that the signal at the anode of each diode is held at 13 volts below the level of the signal at the cathode. To reduce the incidence of transients, each of the Zener diodes 64 and 66 is shunted by each of a pair of capacitors 70 and 72, and 74 and 76, respectively.

In operation, the control signals $V_i$ and $V_i^*$ supplied to the amplifier 16 alternately shift from a first level of $-0.9$ volts to a second level of $-1.75$ volts. In other words, while the signal $V_i$ is at the first level of $-0.9$ volts, the signal $V_i$ is at the second level of $-1.75$ volts and vice versa. When the signals $V_i$ and $V_i^*$ are at the first and second levels, respectively, the FETs 48 and 50 are conductive and nonconductive, respectively. While the FETs 48 and 50 are conductive and nonconductive, respectively, the voltage at the cathode of each of the Zener diodes 64 and 66 is on the order of about 0.5 volts and 4.25 volts, respectively. The signals $V_i'$ and $V_i'^*$ which are developed at the anode of the Zener diodes 64 and 66, respectively, will be on the order of 13 volts less than a separate one of the signals $V_i'$ and $V_i'^*$, respectively. Thus, when the signals $V_i$ and $V_i^*$ are at the first and second levels, the signals $V_i'$ and $V_i'^*$ will be at a level of $-12.5$ volts and $-8.5$ volts, respectively, causing the FETs 24 and 26 to become nonconductive and conductive, respectively. Consequently, the FETs 20 and 22 become nonconductive and conductive, respectively.

When the signals $V_i$ and $V_i^*$ shift to a level of $-1.75$ volts and $-0.9$ volts, respectively, the signals $V_i'$ and $V_i'^*$ shift to a level of $-8.5$ volts and $-12.5$ volts, respectively. Consequently, the FETs 24 and 26 now become conductive and nonconductive, respectively, so that the FETs 20 and 22 become nonconductive and conductive, respectively. As may now be appreciated, when the control signals $V_i$ and $V_i^*$ alternately shift in level from $-0.9$ volts to $-1.75$ volts, the FETs 20 and 22 become alternately conductive, thereby causing current to be alternately sourced to and sunk from the head 12.

The operation of the amplifier 18 is identical to that of amplifier 16. Like the control signals $V_i$ and $V_i^*$, the control signals $V_c$ and $V_c^*$ which are supplied to the amplifier 18 alternate between a first level of $-0.9$ volts and a second level of $-1.75$ volts. While the control signals $V_c$ and $V_c^*$ are at the first and second levels, respectively, the control signals $V_c'$ and $V_c'^*$ produced by the amplifier 18 will be at a level of $-12.5$ and $-8.5$ volts, respectively, causing the FETs 34 and 36 to become nonconductive and conductive, respectively. Conversely, when the control signals $V_c$ and $V_c^*$ are each at a level of $-1.75$ and $-0.9$ volts, the FETs 34 and 36 become conductive and nonconductive, respectively. While the FET 34 remains conductive, the FET 22 is forced nonconductive, notwithstanding the fact that the FET 26 is nonconductive. Under these conditions, a high impedance is presented to the load 12.

In practice, the FETs 20, 22, 24, 26, 30, 34, 36, 48, and 50 are custom-fabricated, microwave-type devices whose gate width (periphery), pinch-off voltage ($V_p$), and saturation drain source current ($I_{dss}$) are given below in Table I. The characteristics chosen for the FETs 20, 22, 24, 26, 30, 34, 36, 48 and 50 enable them to switch at frequencies in excess of 800 MHz, thus affording the driver circuit 10 of the present invention the ability to source and sink current at very high frequencies.

TABLE I

| FETs | Periphery | $V_p$ | $I_{dss}$(ma) |
|---|---|---|---|
| 48 | 900 | −2.2 | 149 |
| 50 | 900 | −2.2 | 149 |
| 60 | 500 | −2.2 | 83 |
| 30 | 1200 | −2.2 | 199 |
| 24 | 3200 | −4 | 545 |
| 26 | 3200 | −4 | 545 |
| 44 | 1200 | −2.2 | 199 |
| 22 | 6400 | −4 | 1090 |
| 34 | 3200 | −4 | 545 |
| 36 | 3200 | −4 | 545 |
| 20 | 6400 | −4 | 1090 |

Exemplary values for each of the resistors 32, 42, 52, 54, 55, 56, 62, 68 and 70, and for each of the capacitors 70 and 72 are listed in Table II below.

TABLE II

| Resistors | Ohms | Capacitors | Capacitance |
|---|---|---|---|
| 32 | 45 | 70 and 74 | 10 nf. |
| 40 and 46 | 35 | 72 and 76 | 10 pf. |
| 42 | 20 | | |
| 52 and 54 | 50 | | |
| 55 and 56 | 70 | | |
| 62 | 230 | | |
| 68 and 70 | 1K | | |

It is to be understood that the embodiments described herein are merely illustrative of the principles of the invention. Various modifications and changes may be made thereto by persons skilled in the art which embody the principles of the invention and fall within the scope and spirit thereof.

What is claimed is:

1. A method for alternately sourcing current to, and for sinking current from a load comprising the steps of:
    generating first and second electrical signals which alternately shift from a first to a second level so as to be 180° out of phase with each other, and
    alternately providing a current path from a first voltage source, at a first potential, to a load and from the load to a second voltage source at a potential less than the first voltage source, when the first and second electrical signals alternately shift in amplitude, CHARACTERIZED IN THAT:
    the first electrical signal is applied to a gate of a first field effect transistor having its drain-to-source portion coupled between a current sink which passes a continuous current and a gate of a second field effect transistor having its drain-to-source portion coupled between the first voltage source and the load, the second field effect transistor, while conductive, providing a path across its drain-to-source portion for current to pass from the first voltage source to the load;
    the second electrical signal is applied to a gate of a third field effect transistor having its drain-to-source portion coupled between the current sink and a gate of a fourth field effect transistor which has its drain-to-source portion coupled between the second voltage source and the load, the fourth field effect transistor, while conductive, providing a path across its drain-to-source portion for current to pass from the load to the second voltage source; and
    the first and third field effect transistors are alternately rendered nonconductive in response to the first and second electrical signals alternately shifting in amplitude from the first to the second level, thereby causing the second and fourth field effect transistors to be alternately rendered conductive.

2. The method according to claim 1, characterized in that during intervals that the first field effect transistor is conductive, a negative voltage is provided between the gate and source of the fourth field effect transistor to render the same nonconductive so that a high impedance is presented to the load.

3. The method according to claim 2, characterized in that the negative voltage is provided between the gate and source of the fourth field effect transistor during intervals while the second field effect transistor is nonconductive by the steps of:
    generating a third electrical signal whose amplitude changes from a first to a second level during intervals while a high impedance is to be presented to the load;
    applying a third electrical signal to a gate of a fifth field effect transistor which has its drain-to-source portion coupled between a second current sink and the junction of the gate of the fourth field effect transistor and a first terminal of a resistor having a second terminal coupled to the second voltage source; and
    rendering the fifth field effect transistor conductive when the third electrical signal changes amplitude from the first to the second level, thereby causing current to be drawn through the resistor from the second voltage source so that a sufficiently negative voltage appears between the gate and source of the fourth field effect transistor to render it substantially nonconductive.

4. The method according to claim 1, characterized in that the first and second electrical signals are generated by the steps of:
    amplifying each of a first and second control signals which alternately shift in amplitude between a first and second level when current is to be sourced to and sunk from the load, respectively; and
    shifting the level of each of the first and second amplified control signals to yield each of the first and second electrical signals, respectively.

5. Apparatus for alternately sourcing current to, and for sinking current from a load comprising:
    first means for generating first and second electrical signals which alternately shift from a first to a second level so as to be 180° out ot phase with each other; and
    second means for alternately providing a current path from a first voltage source at a first potential to the load and from the load to a second voltage source, at a potential less than said first source, when the first and second electrical signals alternately shift in amplitude, the second means characterized by:
    a current sink for passing a continuous current;
    a first field effect transistor having a gate and a drain-to-source portion, the drain-to-source portion being coupled between the load and the first voltage source, the first field effect transistor, while conductive, providing a path across its drain-to-source portion for current to pass from the first voltage source to the load;
    a second field effect transistor having a gate and a drain-to-source portion, the drain-to-source portion of the second field effect transistor being coupled between the load and the second voltage source, the second field effect transistor, while conductive, providing a path across its drain-to-source portion for current to pass from the load to the second voltage source;

a third field effect transistor having a gate and having a drain-to-source portion which is coupled between the current sink and the gate of the first field effect transistor;

a fourth field effect transistor having a gate and a drain-to-source portion which is coupled between the gate of the second field effect transistor and the current sink; and means for supplying the gate of each of the third and fourth field effect transistors with a separate one of first and second electrical signals, respectively, which alternately shift in amplitude when current is to be sourced to and sunk from the load, respectively, to alternately render the third and fourth field effect transistors, respectively, alternately nonconductive thus rendering the first and second field effect transistors alternately conductive.

6. Apparatus for alternately sourcing current to, and for sinking current from a load comprising:

first means for generating first and second electrical signals which alternately shift from a first to a second level so as to be 180° out of phase with each other; and second means for alternately providing a current path from a first voltage source at a first potential to the load and from the load to a second voltage source, at a potential less than said first source, when the first and second electrical signals alternately shift in amplitude, the second means characterized by:

a current sink;

a first field effect transistor having a gate and a drain-to-source portion, the drain-to-source portion being coupled between the load and the first voltage source, the first field effect transistor, while conductive, providing a path across its drain-to-source portion for current to pass from the first voltage source to the load;

a second field effect transistor having a gate and a drain-to-source portion, the drain-to-source portion of the second field effect transistor being coupled between the load and the second voltage source, the second field effect transistor, while conductive, providing a path across its drain-to-source portion for current to pass from the load to the second voltage source;

a third field effect transistor having a gate and having a drain-to-source portion which is coupled between the current sink and the gate of the first field effect transistor;

a fourth field effect transistor having a gate and a drain-to-source portion which is coupled between the gate of the second field effect transistor and the current sink;

means for supplying the gate of each of the third and fourth field effect transistors with a separate one of first and second electrical signals, respectively, which alternately shift in amplitude when current is to be sourced to and sunk from the load, respectively, to alternately render the third and fourth field effect transistors, respectively, alternately nonconductive thus rendering the first and second field effect transistors alternately conductive;

a resistor coupled between the source and gate of the second field effect transistor;

a second current sink;

a fifth field effect transistor having a gate and having a drain-to-source portion coupled between the gate of the second field effect transistor and the current source; and means for supplying the gate of the fifth field effect transistor with a third electrical signal which shifts in amplitude from a first to a second level to render the fifth field effect transistor conductive during intervals while the second field effect transistor is to be nonconductive so that a high impedance is to be presented to the load.

7. The apparatus according to claim 5, characterized in that said means for supplying said first and second electrical signals to the third and fourth field effect transistors, respectively, comprises an amplifier which amplifies and shifts the level of each of the first and second electrical signals.

* * * * *